United States Patent
Zhang et al.

(10) Patent No.: US 8,477,496 B2
(45) Date of Patent: Jul. 2, 2013

(54) ENCLOSURE HAVING GUIDING DEVICE

(75) Inventors: Guang-Yi Zhang, Shenzhen (CN); Meng-Qi Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 221 days.

(21) Appl. No.: 13/179,572

(22) Filed: Jul. 11, 2011

(65) Prior Publication Data

US 2012/0243178 A1 Sep. 27, 2012

(30) Foreign Application Priority Data

Mar. 25, 2011 (CN) .......................... 2011 1 0073525

(51) Int. Cl.
*H05K 7/20* (2006.01)
(52) U.S. Cl.
USPC ............... 361/695; 361/679.02; 361/679.33; 361/679.48; 361/679.5; 361/692; 312/223.1; 312/223.2; 312/236; 165/122; 165/185; 454/184
(58) Field of Classification Search
USPC ....... 361/679.46–679.55, 690–697, 715–724; 165/80.3, 104.33, 121–126, 185; 174/50, 174/50.54, 520, 17 R, 17.08; 312/223.1, 312/223.2, 236; 454/184
See application file for complete search history.

(56) References Cited

U.S. PATENT DOCUMENTS

| 3,905,484 | A  | * | 9/1975  | Dean et al. ..................... 211/184 |
| 6,459,589 | B2 | * | 10/2002 | Manweiler et al. ........... 361/752 |
| 6,603,661 | B2 | * | 8/2003  | Smith et al. ................... 361/695 |
| 6,751,094 | B2 | * | 6/2004  | Kolb et al. ............... 361/679.33 |
| 6,906,914 | B2 | * | 6/2005  | Stamos et al. ........... 361/679.31 |
| 7,145,776 | B2 | * | 12/2006 | King et al. ..................... 361/725 |
| 7,236,361 | B2 | * | 6/2007  | Cote et al. ..................... 361/695 |
| 7,374,259 | B2 | * | 5/2008  | Wu et al. ...................... 312/223.2 |
| 7,864,519 | B2 | * | 1/2011  | Lin et al. ................. 361/679.33 |
| 2004/0130861 | A1 | * | 7/2004 | Beall et al. ..................... 361/682 |
| 2007/0247825 | A1 | * | 10/2007 | Bynum et al. ................ 361/788 |

\* cited by examiner

*Primary Examiner* — Michail V Datskovskiy
(74) *Attorney, Agent, or Firm* — Altis Law Group, Inc.

(57) ABSTRACT

An enclosure includes a housing, partition plates received in the housing, hard disk drives fixed between the partition plates, a cover fixed to the housing, a printed circuit board received in the housing and a fan assembly fixed within the housing. The housing includes a bottom plate and a pair of side plates. Each side plate has a guiding device mounted thereon. The guiding device includes a supporting element fixed to the side plate, a fixing element fixed with the printed circuit board, and a rod pivotably connecting the fixing element with the supporting element. The partition plates each have a hook, and the printed circuit board defines multiple slots corresponding to the hooks. The printed circuit board can be driven towards the partition plates by the fixing element around the supporting element so that the slots are aligned and locked with the hooks.

20 Claims, 13 Drawing Sheets

ENCLOSURE HAVING GUIDING DEVICE

BACKGROUND

1. Technical Field

The present disclosure relates to enclosures for electronic equipment, and particularly, to an enclosure having guiding devices.

2. Description of Related Art

Servers are commonly used to store and process data. A typical server includes an enclosure and a plurality of electronic elements, such as hard disk drives or CPUs (central processing units), mounted within the enclosure. The electronic elements are connected to each other via a printed circuit board. The printed circuit board may be mounted in the enclosure in a vertical orientation, for saving inner space of the enclosure or for other reasons. In order to fix the vertically-oriented printed circuit board therein, the enclosure includes a plurality of hooks, which engage in through holes defined in the printed circuit board.

However, during assembly of the printed circuit board to the enclosure, it is difficult for a human operator to manually align the through holes of the printed circuit board with the hooks of the enclosure, due to the vertical orientation of the printed circuit board. Furthermore, when locking the printed circuit board with the hooks, it is difficult for the operator to control the force he/she needs to apply to achieve the engagement. The operator is liable to cause the printed circuit board to strike electronic elements adjacent to the printed circuit board, resulting in damage to the electronic elements or the printed circuit board.

What is needed, therefore, is an enclosure which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
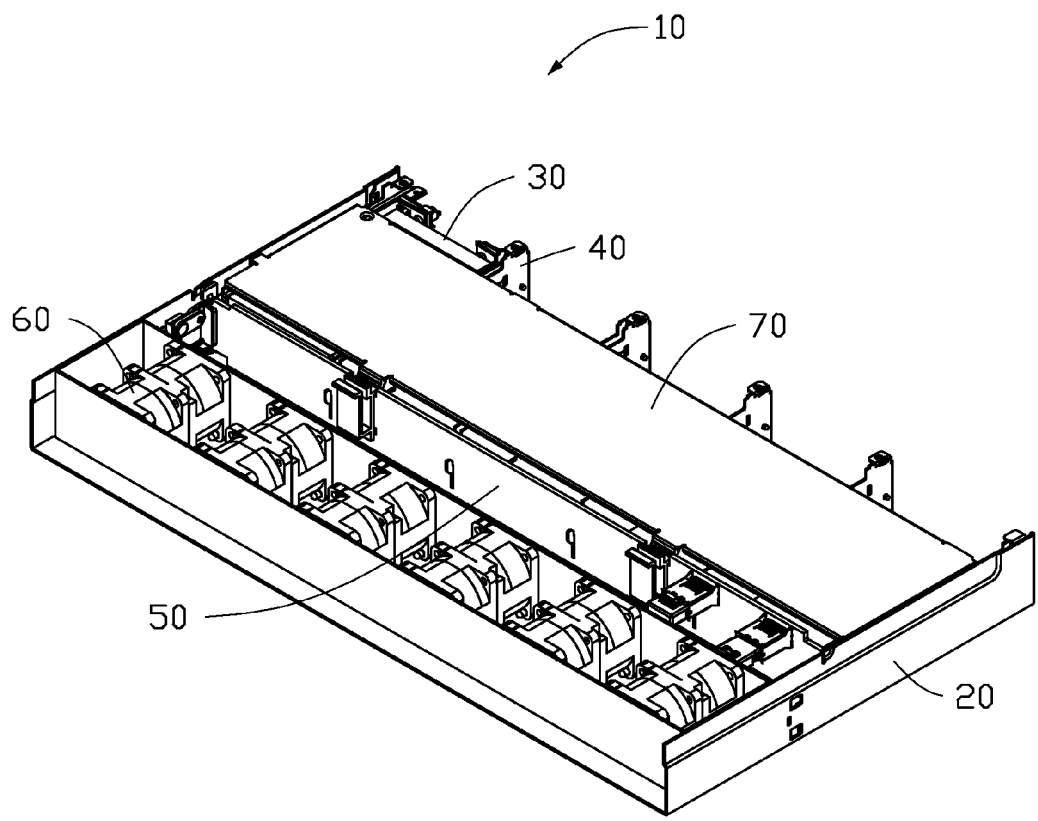
FIG. 1 is an isometric, assembled view of an enclosure in accordance with an embodiment of the present disclosure.
Figure 2:
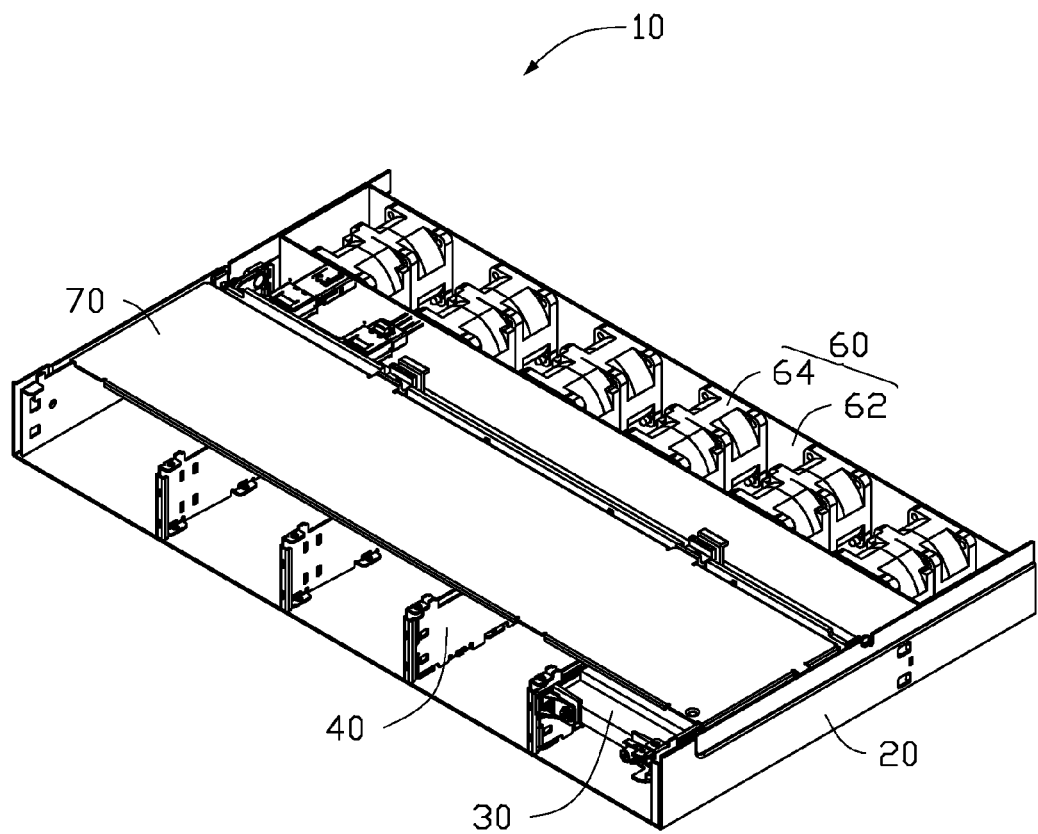
FIG. 2 shows the enclosure of FIG. 1 from a rear aspect.

Referring to FIGS. 1-2, an enclosure in accordance with an embodiment of the present disclosure is shown. The enclosure includes a housing 20, a plurality of partition plates 40 mounted in the housing 20, a plurality of hard disk drives 30 mounted between the partition plates 40, a printed circuit board 50 secured to the partition plates 40, a cover 70 fixed to the housing 20 and covering the hard disk drives 30, and a fan assembly 60 received in the housing 20.

Figure 3:
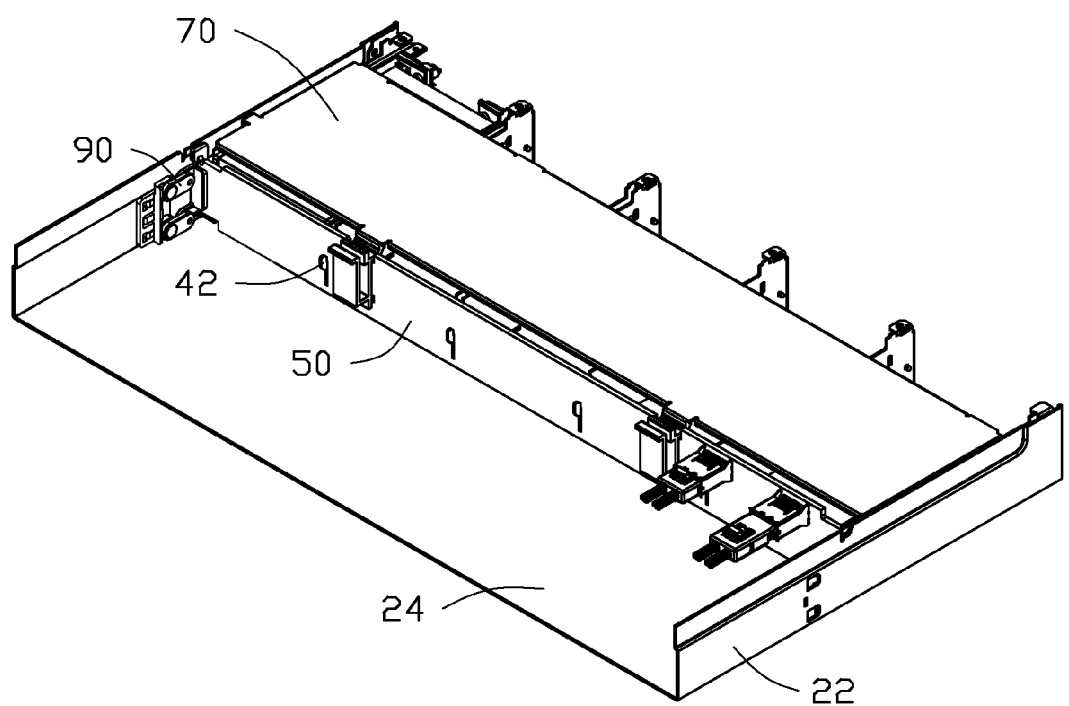
FIG. 3 is similar to FIG. 1, but wherein a fan assembly is removed for clarity.
Figure 4:
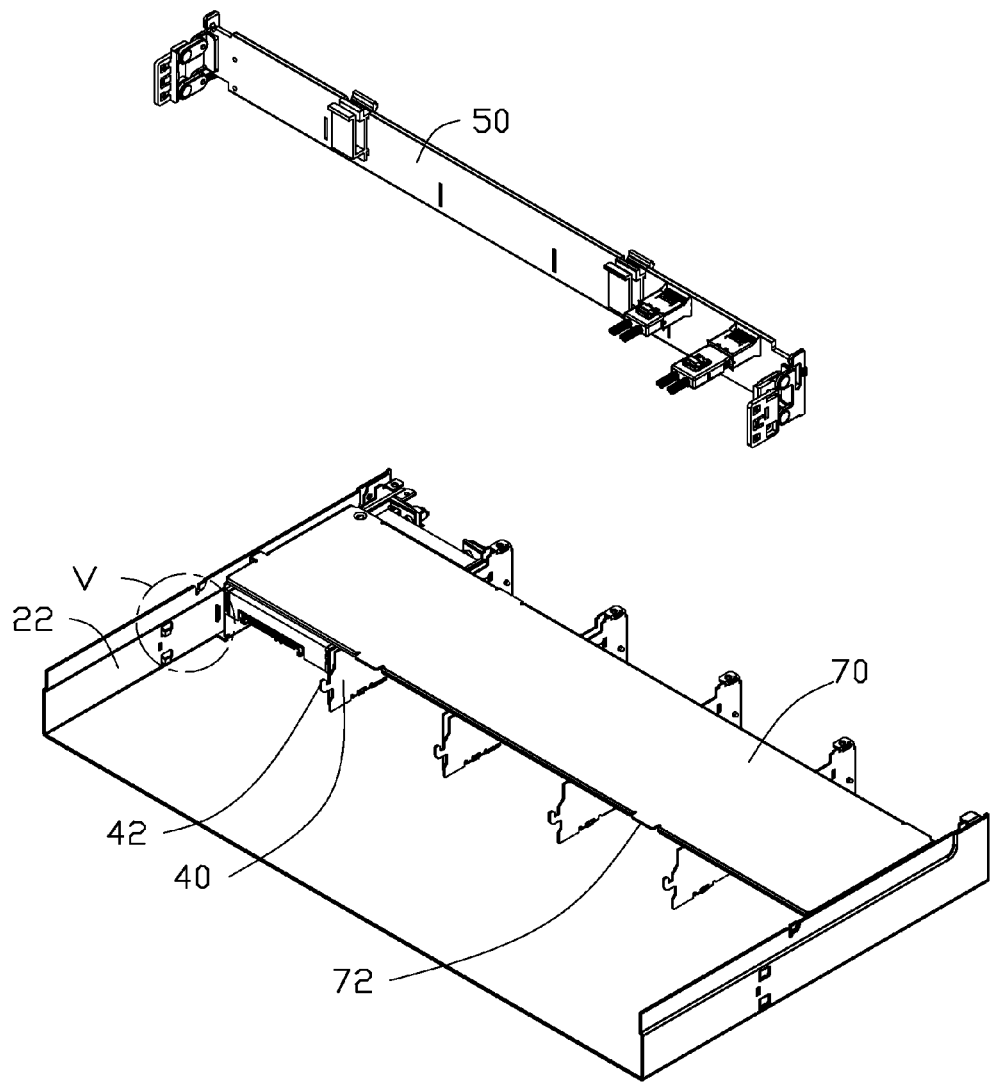
FIG. 4 is a partially exploded view of the enclosure of FIG. 3.
Figure 5:
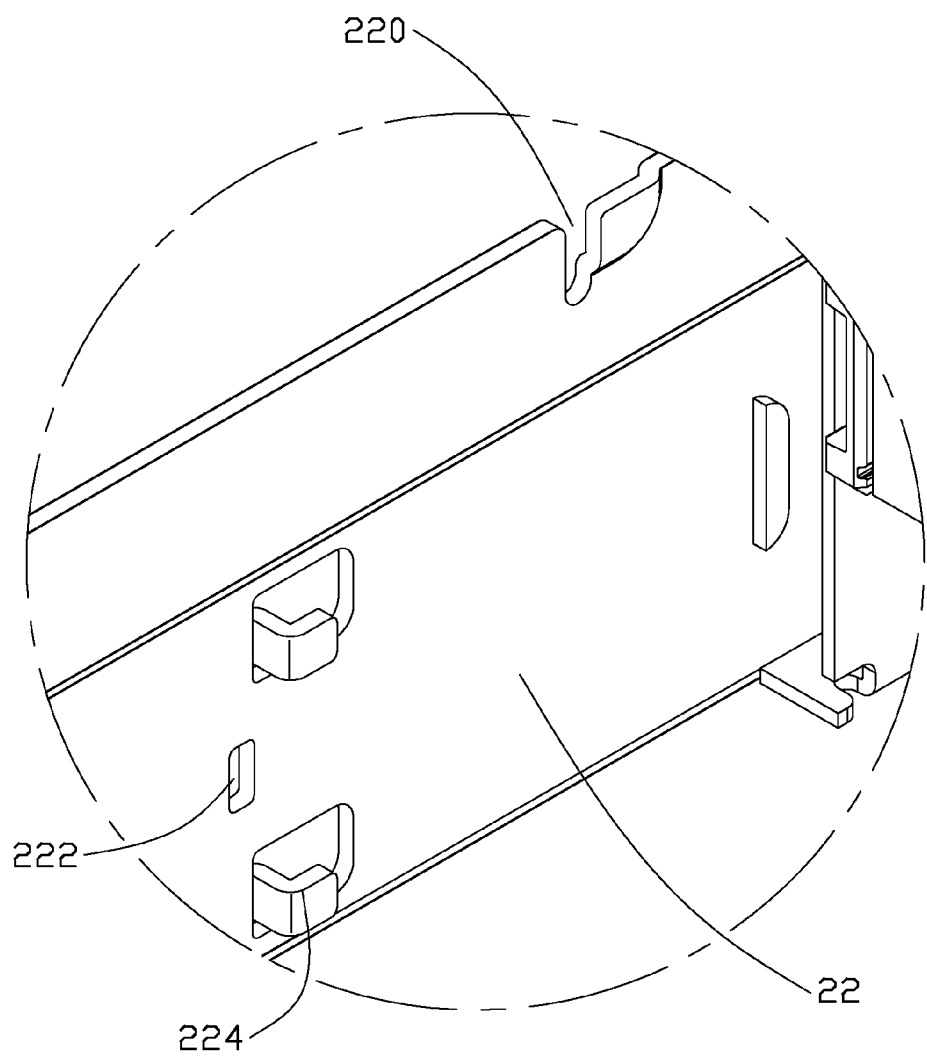
FIG. 5 is an enlarged view of a circled part V of the enclosure of FIG. 4.

Also referring to FIGS. 3-5, the housing 20 includes a bottom plate 24, and a pair of side plates 22 extending upwardly from right and left sides of the bottom plate 24, respectively. Each side plate 22 has a pair of first buckles 224 bent inwardly and a first hole 222 defined between the two first buckles 224. Each side plate 22 further defines a depression 220 at a top thereof. The two first buckles 224 and the first hole 222 are located adjacent to each other, and are spaced a distance from the depression 220.

The partition plates 40 are vertically arranged on the bottom plate 24, between the two side plates 22. The partition plates 40 are parallel to the two side plates 22. Each partition plate 40 has a hook 42 extending firstly horizontally and then upwardly from a front end thereof. Each hard drive disk 30 is fixed between two corresponding adjacent partition plates 40. The cover 70 is secured to the two side plates 22 to overlay the hard disk drives 30. The cover 70 has two tabs 72 extending horizontally frontwards towards the printed circuit board 50.

Figure 6:
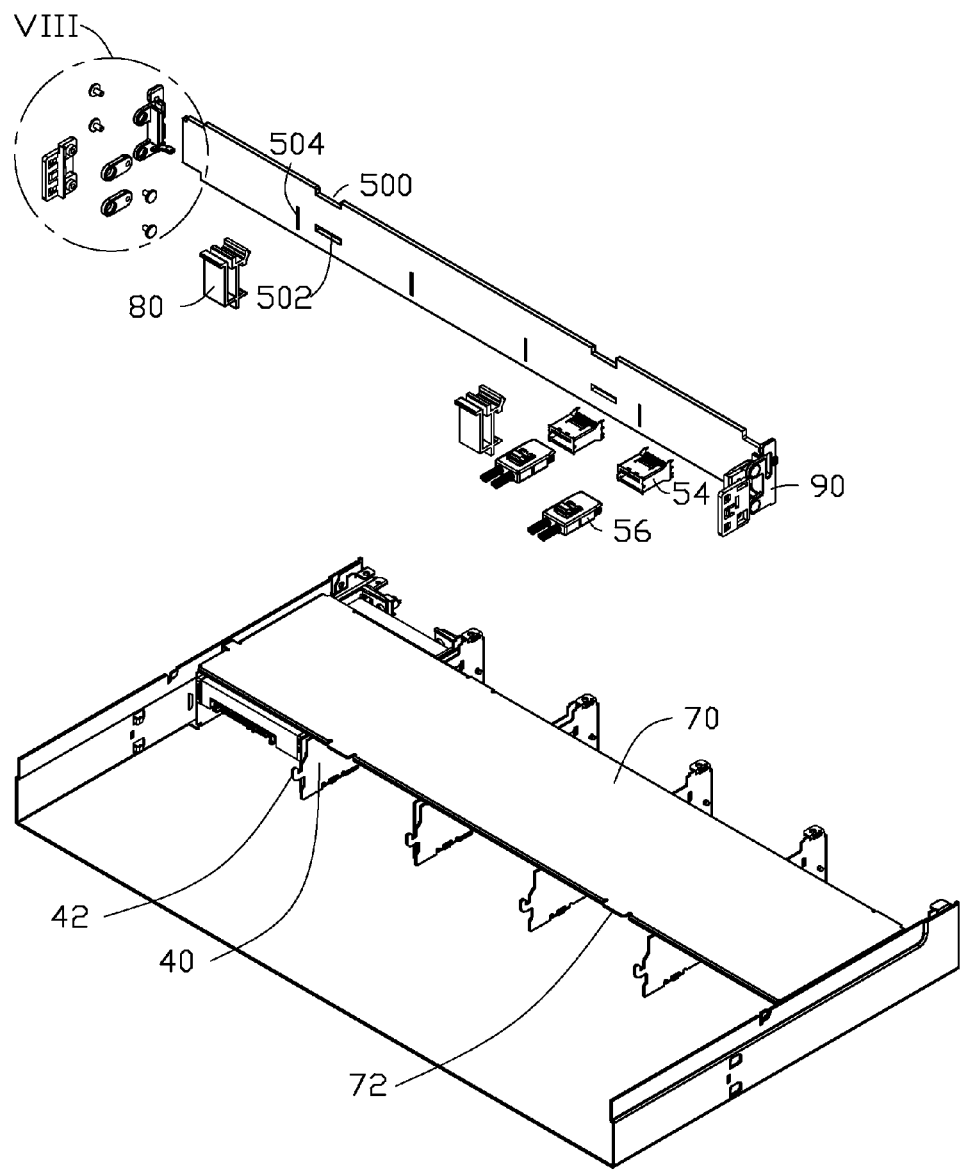
FIG. 6 is a further exploded view of the enclosure of FIG. 4.

Also referring to FIG. 6, the printed circuit board 50 has an elongated configuration. The printed circuit board 50 defines a plurality of slots 504 corresponding to the hooks 42, respectively. The slots 504 are parallel to each other and extended along a vertical direction. The slots 504 can receive the hooks 42 of the partition plates 40 therein to fix the printed circuit board 50 to the partition plates 40. The printed circuit board 50 further defines two pairs of grooves therein. Each pair of grooves are located between two corresponding adjacent slots 504. Each pair of grooves includes a first groove 500 in a top of the printed circuit board 50, and a second groove 502 approximately midway along a height of the printed circuit board 50. The first groove 500 is parallel to the second groove 502, and the first and second grooves 500, 502 are perpendicular to the slot 504.

Figure 9:
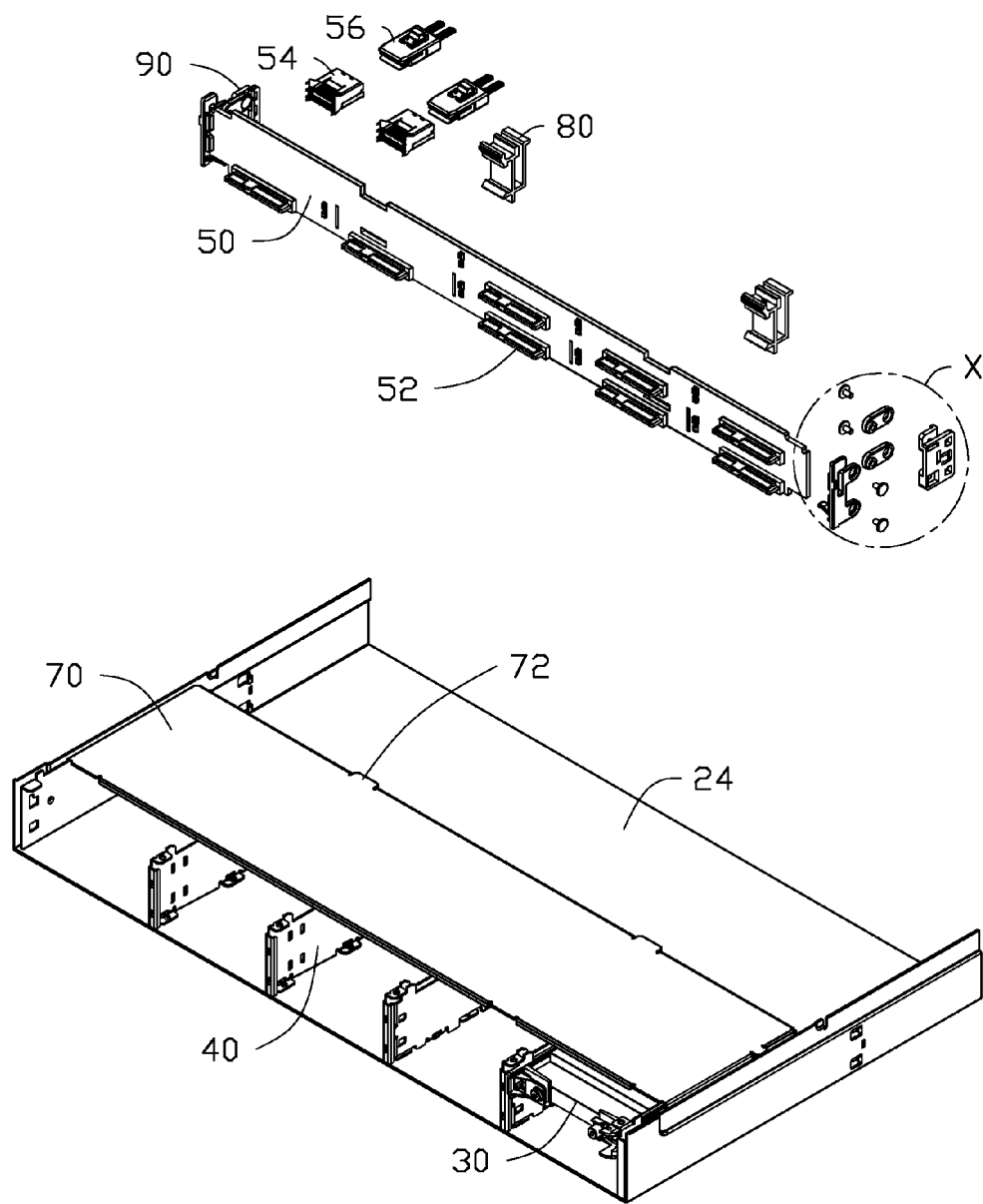
FIG. 9 is a view of the enclosure of FIG. 6 from a rear aspect.

Also referring to FIG. 9, a plurality of first connectors 52 are formed on a rear side of the printed circuit board 50. The first connectors 52 can be connected to the hard disk drives 30 to electrically connect the hard disk drives 30 with the printed circuit board 50. A pair of ports 54 and a corresponding pair of second connectors 56 are mounted on a front side of the printed circuit board 50. Each port 54 is fixed to the printed circuit board 50. Each second connector 56 is inserted into a corresponding port 54 to exchange data with the hard disk drives 30 through the printed circuit board 50.

Figure 7:
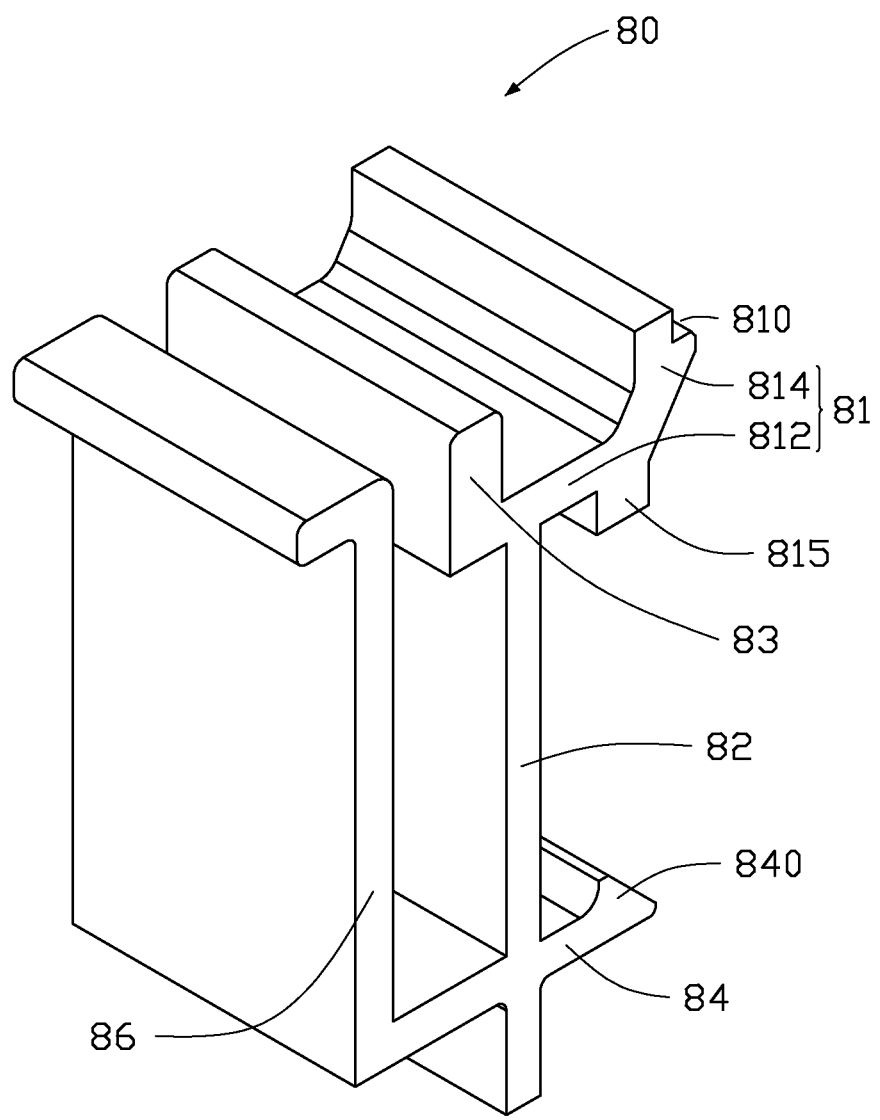
FIG. 7 is an enlarged view of an elastic element of the enclosure of FIG. 6.

Also referring to FIG. 7, two elastic elements 80 are fixed to the printed circuit board 50 for further fixing the printed circuit board 50 to the cover 70. Each elastic element 80 includes a body 82, and four branches 81, 83, 84, 86 divergently extending from the body 82. In particular, a first branch 81 and a second branch 83 extend oppositely from a top portion of the body 82, and a third branch 84 and a fourth branch 86 extend oppositely from a lower portion of the body 82.

The first branch 81 has a first portion 812 extending horizontally from the top portion of the body 82, and a second portion 814 extending inclinedly and upwardly from the first portion 812. The second portion 814 of the first branch 81 defines a third groove 810 in a corner thereof, for partially accommodating a corresponding tab 72 of the cover 70 therein. A rib 815 extends downwardly from a junction of the first portion 812 and the second portion 814 of the first branch 81. The rib 815 and the body 82 can cooperatively sandwich the printed circuit board 50 therebetween, thereby facilitating fixing of the elastic element 80 to the printed circuit board 50. The first portion 812 can be received in the first groove 500 defined in the top of the printed circuit board 50 to position the elastic element 80 to the printed circuit board 50. The second branch 83 has an L shape. The third branch 84 extends backwards and horizontally. The third branch 84 forms a triangular-shaped first protrusion 840 extending upwardly from an end thereof. The third branch 84 can be inserted into the second groove 502 of the printed circuit board 50. The first protrusion 840 abuts against the rear side of the printed circuit board 50 after the third branch 84 is inserted into the second groove 502, thereby preventing the third branch 84 from sliding out of the second groove 502. In addition, the first protrusion 840 and the body 82 can cooperatively sandwich the printed circuit board 50 therebetween, thereby facilitating fixing of the elastic element 80 to the printed circuit board 50. In other words, the first branch 81 and the third branch 84 cooperate to fix the elastic element 80 to the printed circuit board 50. The fourth branch 86 extends frontwards and upwardly towards the fan assembly 60.

Figure 8:
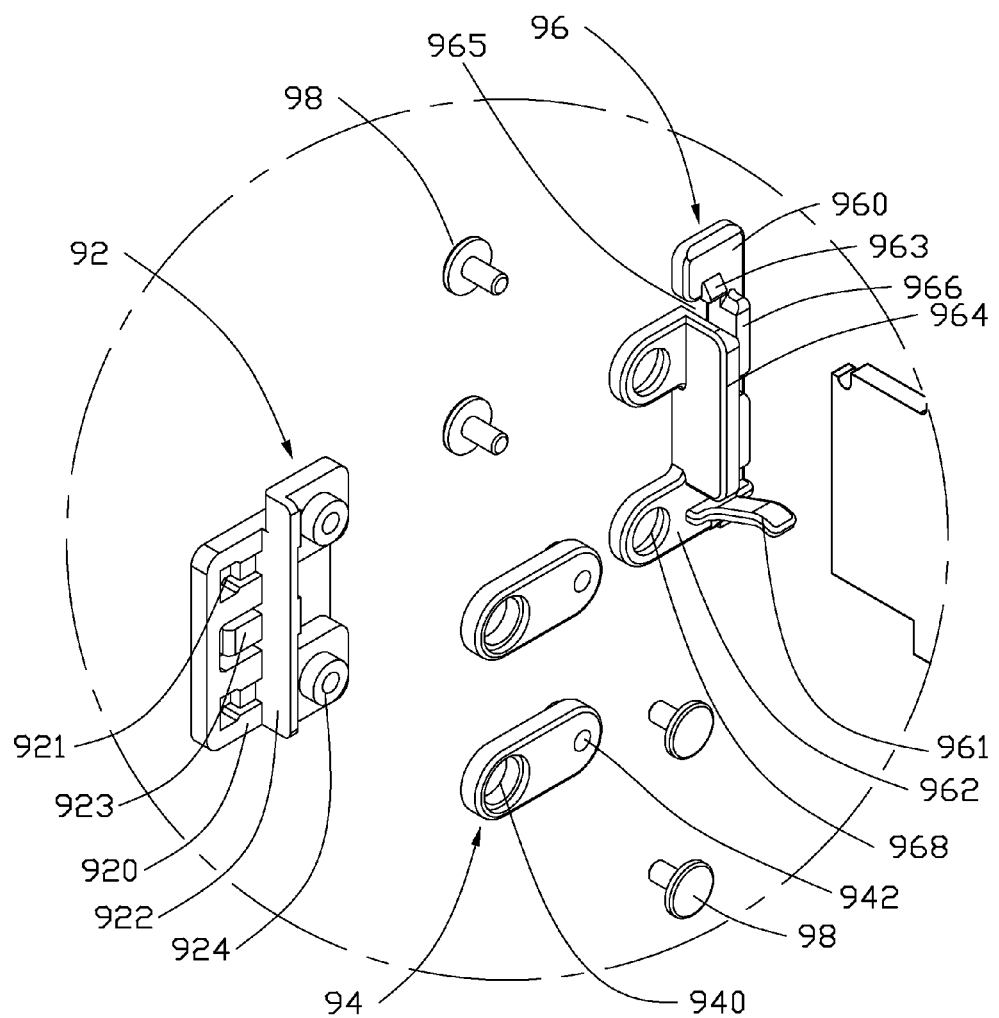
FIG. 8 is an enlarged view of a circled part VIII of the enclosure of FIG. 6.
Figure 10:
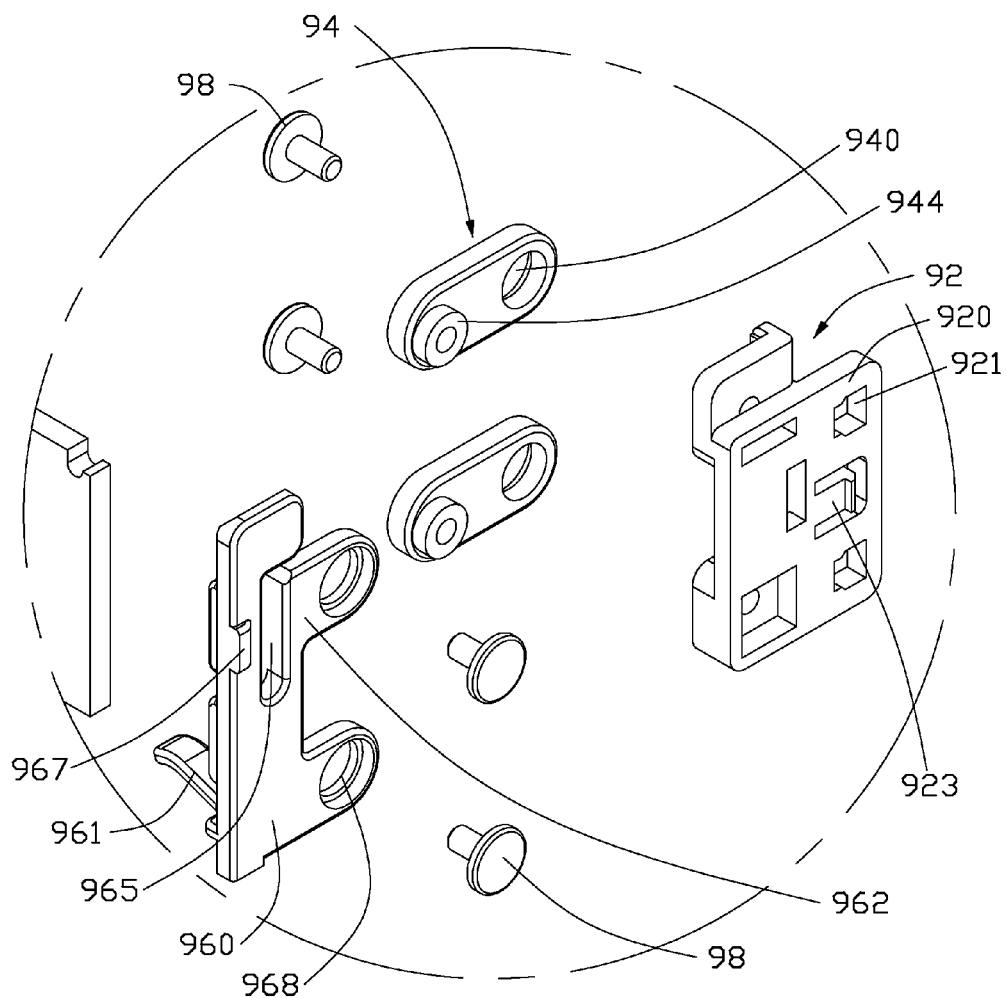
FIG. 10 is an enlarged view of a circled part X of the enclosure of FIG. 9.

Also referring to FIGS. 8 and 10, two guiding devices 90 are fixed to the two side plates 22, respectively, to guide the printed circuit board 50 to move towards the hooks 42. Each guiding device 90 includes a supporting element 92, a fixing element 96, and a pair of rods 91 pivotably attaching the fixing element 96 to the supporting element 92. The supporting element 92 includes a base 920, a pair of first posts 924 protruding inwardly from the base 920, and a first flange 922 extending inwardly from the base 920. The base 920 defines a pair of second holes 921, and forms a second buckle 923 between the pair of second holes 921. The two second holes 921 of the base 920 engagingly receive the two first buckles 224 of the side plate 22 therein, respectively, and the second buckle 923 of the base 920 is engaged in the first hole 222 of the side plate 22, whereby the supporting element 92 is fixed to the side plate 22. Each first post 924 is inserted into a corresponding rod 94, and is in pivotable connection with the rod 94. The first flange 922 is located between the two first posts 924 and the two second holes 921. The first flange 922 is used for abutting against the two rods 94 when the two rods 94 are rotated in vertical orientations around the two first posts 924, thereby positioning the two rods 94 to the supporting element 92. Each rod 94 defines a first opening 940 in an end thereof, and forms a second post 944 on an opposite end thereof. A through hole 942 is defined through the second post 944 for receiving a corresponding pin 98 therein. A corresponding one of the first posts 924 of the supporting element 92 is received in the first opening 940 of the rod 94 and fastened by a corresponding pin 98, thereby pivotably attaching the rod 94 to the supporting element 92.

The fixing element 96 of each guiding device 90 is used to retain an end of the printed circuit board 50 therein to thereby be secured with the printed circuit board 50. The fixing element 96 includes a substrate 960, a pair of arms 962 extending from a front side of the substrate 960, a tongue 961 extending inwardly from an inner side of the substrate 960, and a wall 966 and a second flange 964 extending inwardly from the inner side of the substrate 960. The substrate 960 is parallel to both the base 920 of the supporting element 92 and the side plate 22. The substrate 960 has a second protrusion 967 protruding outwardly from an outer side thereof. The second protrusion 967 can be received in the depression 220 of the side plate 22 to readily position the fixing element 96 to the housing 20, preventing the fixing element 96 from rotating when mounting the printed circuit board 50 to the fixing element 96. The two arms 962 each define a second opening 968 to receive a corresponding one of the second posts 944 therein, and thereby the fixing element 96 is pivotably attached to the two rods 94 through two corresponding pins 98. The second flange 964 is located adjacent to a front side of the substrate 960. The second flange 964 is used for abutting against an upper one of the rods 94 when the upper rod 94 is oriented vertically, thereby positioning the upper rod 94 between the first flange 922 and the second flange 964. The wall 966 is parallel to the second flange 964. A channel 965 is defined between the wall 966 and the second flange 964 to receive a corresponding end of the printed circuit board 50 therein. An upper part of the channel 965 penetrates the outer side of the substrate 960.

A third protrusion 963 is located at a top of the channel 965. The third protrusion 963 has an inclined top face and a flat bottom face generally adjacent to a bottom end of the top face. The inclined top face of the third protrusion 963 is used to guide the printed circuit board 50 to slide downwardly into the channel 965. The bottom face of the third protrusion 963 is used to press against the top of the printed circuit board 50 when the printed circuit board 50 is substantially received in the channel 965, thereby fixing the printed circuit board 50 in the channel 965. The tongue 961 is located at a bottom of the channel 965. The tongue 961 is elastically deformable, to support a bottom of the printed circuit board 50 thereon.

The fan assembly 60 includes a frame 62, and a plurality of fans 64 fixed in the frame 62. The fan assembly 60 is located in front of the printed circuit board 50 for generating airflow towards the hard disk drives 30.

Figure 11:
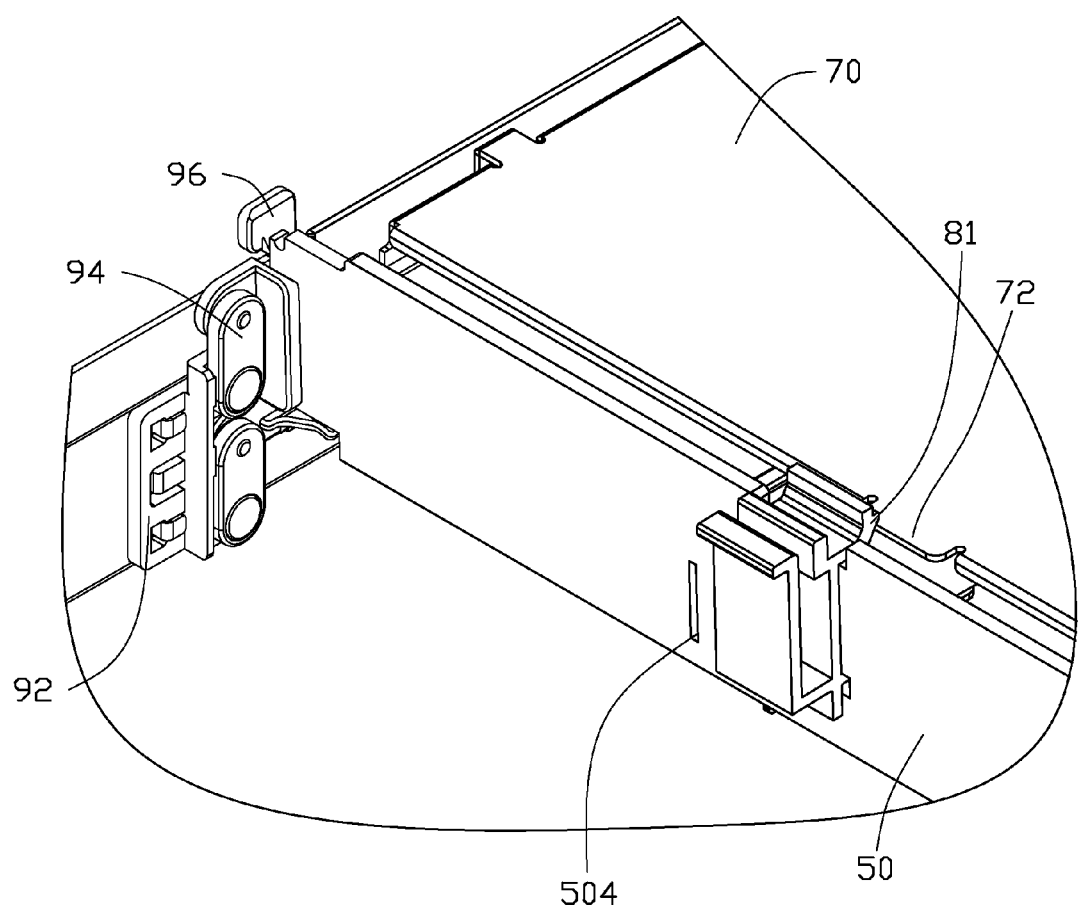
FIG. 11 is similar to an enlarged view of part of the enclosure of FIG. 1, showing a printed circuit board mounted to a guiding device of the enclosure, but showing the guiding device in a closed status in which the guiding device holds the printed circuit board in an initial unlocked position.

Since the two guiding devices 90 have the same configurations and operation principles, in general, only one will be described hereinbelow for brevity. Also referring to FIGS. 11-13, when the printed circuit board 50 is required to be mounted within the housing 20 to connect with the hard disk drives 30, first, the guiding device 90 is readily positioned to a closed status as shown in FIG. 11. In the closed status, the two rods 94 are oriented vertically and sandwiched between and abut against the first flange 922 and the second flange 964, and the second protrusion 967 is retained in the depression 220 of the side plate 22 of the housing 20. The elastic elements 80 are fixed on the printed circuit board 50, with the first branch 81 of each elastic element 80 engaging in a corresponding one of the first grooves 500 of the printed circuit board 50, and the third branch 84 of the elastic element 80 engaging in a corresponding one of the second grooves 502 of the printed circuit board 50. The end of the printed circuit board 50 is then brought to slide into the channel 965 of the fixing element 96, with the end of the printed circuit board 50 riding over the third protrusion 963 until a bottom face of the end of the printed circuit board 50 presses against the tongue 961. Thereby, the printed circuit board 50 is fixed within the channel 965 of the fixing element 96. Thus in the closed status, the guiding devices 90 hold the printed circuit board 50 in an initial unlocked position.

Figure 12:
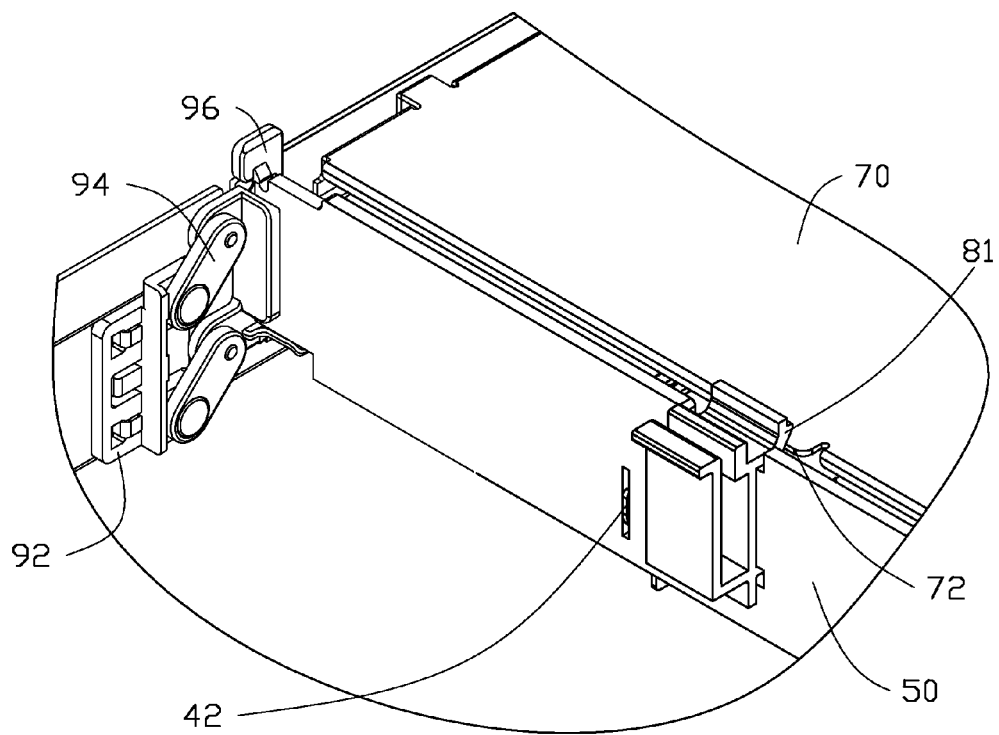
FIG. 12 is similar to FIG. 11, but showing the printed circuit board driven down a distance by the guiding device to a position in which a hook of the enclosure is aligned with and inserted into a slot of the printed circuit board.
Figure 13:
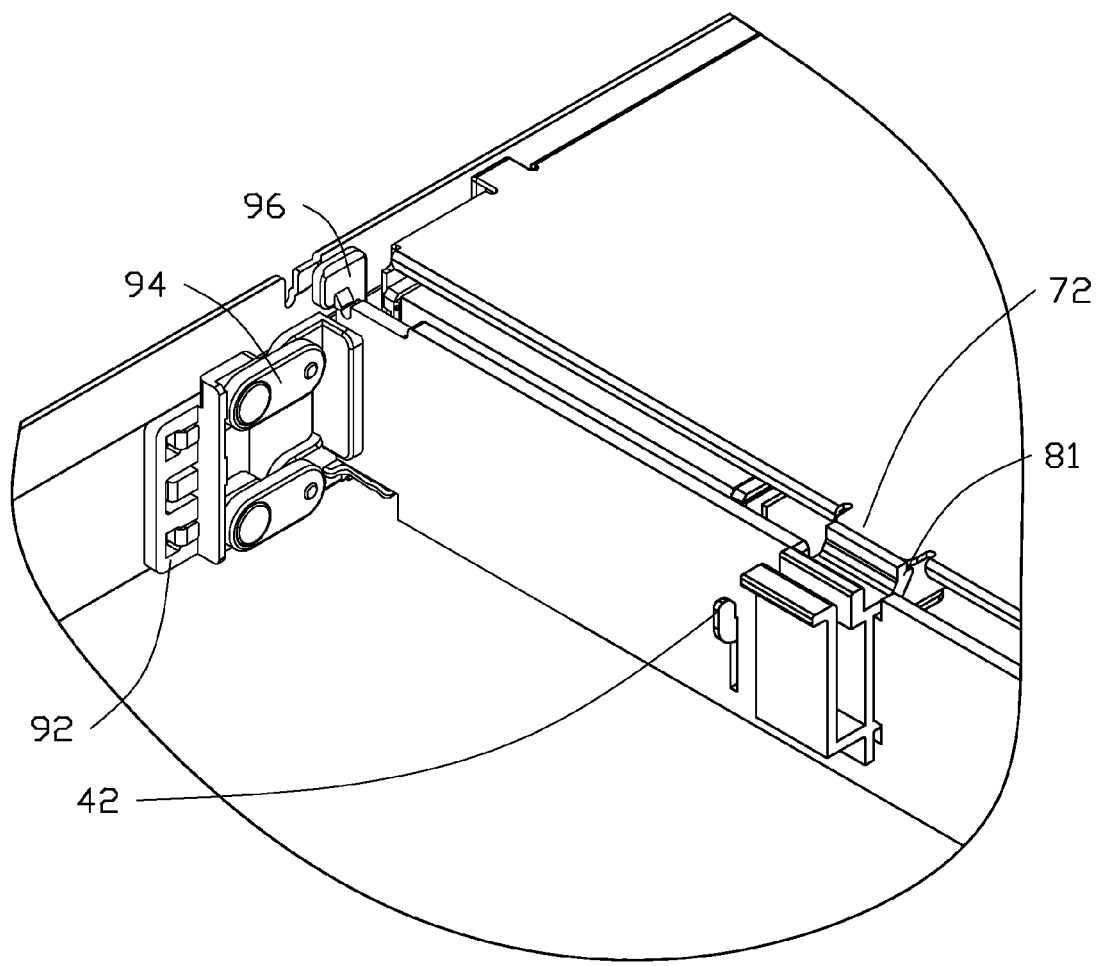
FIG. 13 is similar to FIG. 12, but showing the printed circuit board driven fully down by the guiding device, wherein the guiding device is in an open status in which the guiding device holds the printed circuit board in a locked position with the hook engaged in the slot.

The second protrusion 967 is then pulled from the depression 220 of the side plate 22, and the fixing element 96 of the guiding device 90 is rotated rearwards and downwards around the first posts 924 of the supporting element 92. The printed circuit board 50 is driven by the fixing element 96 to move towards the hooks 42, wherein the slots 504 of the printed circuit board 50 align with and receive the hooks 42, as shown in FIG. 12. The fixing element 96 is continued to be rotated rearwards and downwards until the guiding device 90 is positioned in an open status, as shown in FIG. 13. In the open status, the rods 94 are oriented horizontally and perpendicular to the first flange 922 and the second flange 964. In the open status of the guiding device 90, the printed circuit board 50 is driven by the fixing element 96 such that the hooks 42 engage in the slots 504, thereby realizing locking of the printed circuit board 50 to the partition plates 40.

In addition, during the movement of the printed circuit board 50 towards the hooks 42, the inclined second portions 814 of the first branches 81 of the elastic elements 80 contact the tabs 72 of the cover 70, and are urged by the tabs 72 to elastically deform towards the second branches 83. When the printed circuit board 50 is driven by the guiding device 90 to lock with the hooks 42, the tabs 72 of the cover 70 are retained in the third grooves 810 of the first branches 81 of the elastic elements 80, thereby pressing the printed circuit board 50 downwardly via the elastic elements 80. As a result, the printed circuit board 50 is firmly fixed within the housing 20 by both the tabs 72 and the hooks 42. Therefore, with the guidance and operation of the guiding devices 90, the printed circuit board 50 is conveniently and accurately fixed within the housing 20.

It is believed that the present disclosure will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. An enclosure comprising:
    a housing comprising a bottom plate and a pair of side plates extending from two opposite sides of the bottom plate;
    a partition plate mounted on the bottom plate and having a hook;
    an electronic component received in the housing;
    a printed circuit board defining a slot therein; and
    a guiding device mounted to one of the pair of side plates, the guiding device comprising:
        a supporting element fixed to the one of the pair of side plates;
        a fixing element fixed with the printed circuit board; and
        a rod pivotably connecting the fixing element with the supporting element;
    wherein the fixing element is rotatable around the supporting element to drive the printed circuit board to move towards the partition plate, such that the slot of the printed circuit board aligns with and engagingly receives the hook, thereby fixing the printed circuit board to the partition plate.

2. The enclosure of claim 1, wherein the fixing element comprises a substrate, a flange and a wall extending from the substrate, the flange and the wall defining a channel therebetween to receive an end of the printed circuit board.

3. The enclosure of claim 2, wherein the fixing element further comprises a tongue extending from the substrate, the tongue being located at a bottom of the channel.

4. The enclosure of claim 3, wherein the tongue is elastically deformable to support a bottom of the printed circuit board thereon.

5. The enclosure of claim 2, wherein the fixing element further comprises a protrusion protruding towards the printed circuit board, the protrusion being located at a top of the channel.

6. The enclosure of claim 5, wherein the protrusion has an inclined top face and a flat bottom face adjacent to the inclined top face, the inclined top face of the protrusion being operable to guide the printed circuit board to slide into the channel, the flat bottom face pressing a top of the printed circuit board downwardly after the end of the printed circuit board is received in the channel.

7. The enclosure of claim 5, wherein the fixing element further comprises another protrusion protruding from the substrate in a direction away from the printed circuit board, the another protrusion being retainable in a depression defined in a top of the one of the pair of side plates.

8. The enclosure of claim 2, wherein the fixing element further comprises an arm extending from the substrate towards the supporting element, the arm being pivotably attached to an end of the rod.

9. The enclosure of claim 8, wherein the supporting element comprises a base and a post extending from the base in a direction away from the one of the pair of side plates, the post being extended into another end of the rod to pivotably attach the rod to the supporting element.

10. The enclosure of claim 9, wherein the supporting element comprises a flange extending from the base in a direction away from the one of the pair of side plates, the flange of the supporting element being located adjacent to the post.

11. The enclosure of claim 10, wherein the rod is rotatable to a vertical orientation where the rod is sandwiched between and abut against the flanges of the supporting element and the fixing element.

12. The enclosure of claim 10, wherein the rod is rotatable to a horizontal orientation where the rod is perpendicular to the flanges of the supporting element and the fixing element.

13. The enclosure of claim 9, wherein the supporting element comprises a buckle extending from the base towards the one of the pair of side plates, the buckle being locked with the one of the pair of side plates.

14. The enclosure of claim 1, further comprising a cover fixed to the pair of side plates and covering the electronic component, wherein the cover has a tab extending towards the printed circuit board.

15. The enclosure of claim 14, further comprising an elastic element fixed to the printed circuit board, wherein the elastic element comprises a body, a branch extended towards the cover and another branch, the branch being secured with the tab of the cover.

16. The enclosure of claim 15, wherein the branch of the elastic element comprises a first portion extending horizontally from a top of the body and a second portion extending inclinedly and upwardly from the first portion, the second portion defining a groove in a corner thereof to engage the tab therein.

17. The enclosure of claim 16, wherein the printed circuit board defines a groove in a top thereof, the first portion of the branch of the elastic element being retained in the groove.

18. The enclosure of claim 16, wherein the elastic element further comprises a rib extended downwardly from a junction of the first portion and the second portion of the branch, the rib and the body pressing against two opposite sides of the printed circuit board, respectively.

19. The enclosure of claim 17, wherein the another branch is extended from a lower portion of the body, the printed circuit board defining another groove through which the another branch is extended.

20. The enclosure of claim 1, further comprising a fan assembly fixed to the bottom plate and between the pair of side plates, wherein the fan assembly comprises a frame and a plurality of fans received in the frame.

* * * * *